United States Patent [19]

Braund

[11] 3,951,492

[45] Apr. 20, 1976

[54] TRAPPED BOW CONTACT AND CONNECTOR USING THE SAME

[75] Inventor: Kenneth W. Braund, Willoughby, Ohio

[73] Assignee: A P Products Incorporated, Painesville, Ohio

[22] Filed: Nov. 13, 1974

[21] Appl. No.: 523,221

[52] U.S. Cl. .................. 339/17 LC; 339/176 M; 339/217 R
[51] Int. Cl.² ........................................ H01R 13/58
[58] Field of Search ............ 339/17 R, 17 L, 17 LC, 339/17 LM, 17 CF, 174, 176 M, 176 MF, 176 MP, 217 S, 217 R, 220 R, 221 M, 192

[56] References Cited
UNITED STATES PATENTS

| | | | |
|---|---|---|---|
| 3,101,231 | 8/1963 | Klostermann | 339/176 MP |
| 3,482,201 | 12/1969 | Schneck | 339/176 MP |
| 3,683,317 | 8/1972 | Walkup | 339/176 MP |
| 3,748,631 | 7/1973 | Brorein | 339/176 MP |

FOREIGN PATENTS OR APPLICATIONS 1,107,967   3/1968   United Kingdom ............ 339/176 M Primary Examiner—Roy Lake
Assistant Examiner—Neil Abrams
Attorney, Agent, or Firm—Donnelly, Maky, Renner & Otto

[57] ABSTRACT

An electrical connector includes a plurality of trapped bow contacts soldered at respective tail portions to termination pads on a printed circuit board and adapted to deform upon engagement with inserted connector pins to provide large surface area electrical connections with such pins without applying any stress to the solder joints at the printed circuit board. The contacts are carried on an interstitial member adapted for location within a housing structure, and such member and contacts may be removed and replaced by a similar different size member and/or contacts for electrical connection with connector pins of a different corresponding size and/or spacing.

15 Claims, 3 Drawing Figures

TRAPPED BOW CONTACT AND CONNECTOR USING THE SAME

BACKGROUND OF THE INVENTION

This invention relates to a socket type electrical connector having electrical contacts for providing electrical connections between printed circuits and respective connector pins and more particularly relates to such a connector having stress-free connections between contacts and printed circuits. Moreover, the invention is directed to such an electrical connector which is easily adaptable for use with connector pins of various sizes.

A problem with prior art connector contacts soldered to printed circuit boards or the like to facilitate electrically coupling circuits on the latter to an external connector pin array, for example, in a male connector forming part of a cable termination assembly, is the often occurring stress on the solder joints tending to enhance solder creep. Solder creep is the tendency of solder to flow even after having solidified, and such flowing can eventually allow the contact to become free from the circuit to which it is soldered resulting in an open circuit condition or other connection failure. The forces on the solder joint may be either linear, which occur as a male connector pin first abuts the female contact, or tensile, which occur as the male connector pin causes the female contact to deform often causing the soldered portion of the latter to tend to lift from the circuit to which it is soldered. Moreover, some prior art deformable connector contacts are limited in their range of deformations over which they can be used without damaging the same, and, therefore, are similarly limited in the size and/or spacing parameters of connector pins to be accommodated.

SUMMARY OF THE INVENTION

Briefly described, the connector of the instant invention eliminates the stress at the connector contact solder joints to printed circuits or the like and comprises a housing in which the deformable bow portion of a female curved bowed contact is retained in a contact-retaining groove of an interstitial member positioned for electrical connection with an electrically conductive member, such as a male connector pin or a printed circuit on a circuit board, inserted through an opening in the housing. Thus, a shoulder defined at the juncture of the bow and tail portions or by a cut-out in the tail portion normally is in abutment with the groove wall intermittently defined by the stakes so that when the bow portion is deformed by an electrically conductive member inserted into the housing no linear force is transmitted to the remote end of the tail portion attached to the printed circuit termination pad; and due to the positional relation of the connector and printed circuit board no tensile force is exerted on the solder joint. Therefore, the solder joint remains completely stress-free, and solder creep is kept to a minimum.

Moreover, the interstitual member and/or contacts may be replaced in the housing for adapting the connector to accommodate connector pins of various size and spacing parameters, and the connector may be used either as a cable termination connector with an internal printed circuit board or as an output connector for a printed circuit board per se. Also, a balance of the contact forces between the inserted pin rows increases the effectiveness of connections of respective pins and contacts deformed thereby, which present relatively large surface areas for such connections.

Accordingly, a primary object of the invention is to provide an electrical connector improved in the noted respects.

Another object of the invention is to eliminate stress to the contact solder joints at which the connector is attached to a substrate.

An additional object of the invention is to provide a bow contact arrangement which is capable of a wide range of deformations without being subject to damage.

A further object of the invention is to provide a relatively large flat surface area connection between inserted connector pins and respective bow contacts in an electrical connector.

Still another object of the invention is to provide an electrical connector adaptable for accommodating connector pins of various sizes and/or spacing while requiring a minimum number of parts to maintain reasonable inventories.

These and other objects and advantages of the present invention will become more apparent as the following description proceeds.

To the accomplishment of the foregoing and related ends, the invention, then, comprises the features hereinafter fully described in the specification and particularly pointed out in the claims, the following description and the annexed drawing setting forth in detail a certain illustrative embodiment of the invention, this being indicative, however, of but one of the various ways in which the principles of the invention may be employed.

DESCRIPTION OF THE PREFERRED EMBODIMENT

Figure 1:
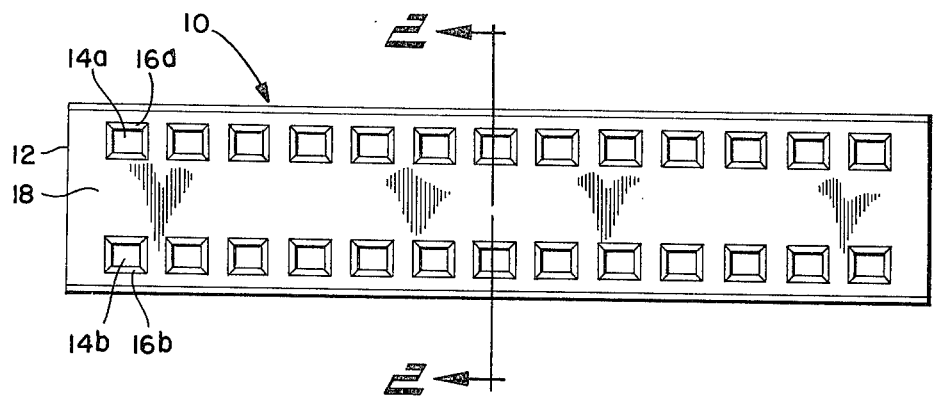
FIG. 1 is a front elevation view of a connector in accordance with the invention.

Referring now to the drawing, wherein like reference numerals refer to like elements in the several figures, a female electrical connector generally indicated at 10 for electrical connection with a plurality of connector pins from a male electrical connector, not shown, is illustrated in FIG. 1. The electrical connector includes a housing 12 of electrically non-conductive material such as plastic, glass filled nylon, phenolic material or other similar material, in which a plurality of trapped bow-type electrical contacts are retained, each being adapted for electrical connection to respective connector pins for electrically coupling the same to circuits on a printed circuit board or the like and each preferably being similar to the electrical contacts disclosed in U.S. patent application for "Bow Contact and Connector Using the Same", Ser. No. 480,695, filed June 19, 1974, and assigned to the same assignee as the instant patent application. A plurality of connector pin receiving openings 14a, 14b, the letters a and b referring to identical parts in upper and lower parts of the electrical connector 10, have beveled entrances 16a, 16b and are located in the front wall 18 defining the front face of the housing 12 for receipt of electrically conductive pins arranged in an array or pattern substantially corresponding to that of the openings in such front face providing such pins access to respective contacts.

The number of openings 14a, 14b in the connector housing 12 may be varied from as few, for example, as a single opening to as many as twenty openings in each of the upper and lower rows. Alternatively, the openings may be formed only in one row for connection to a single row of respective connector pins; and a further modification of the connector 10 includes the use of a single broad opening in place of the plurality of relatively small openings 14a, 14b, for example, for receiving an electrically conductive member, such as a printed circuit board or the like into the housing 12. Moreover, as will become more apparent from the description below, the electrical connector 10 is particularly suited as a cable termination device using an internal printed circuit board interface or as an output connector directly coupled to an external printed circuit board.

Figure 2:
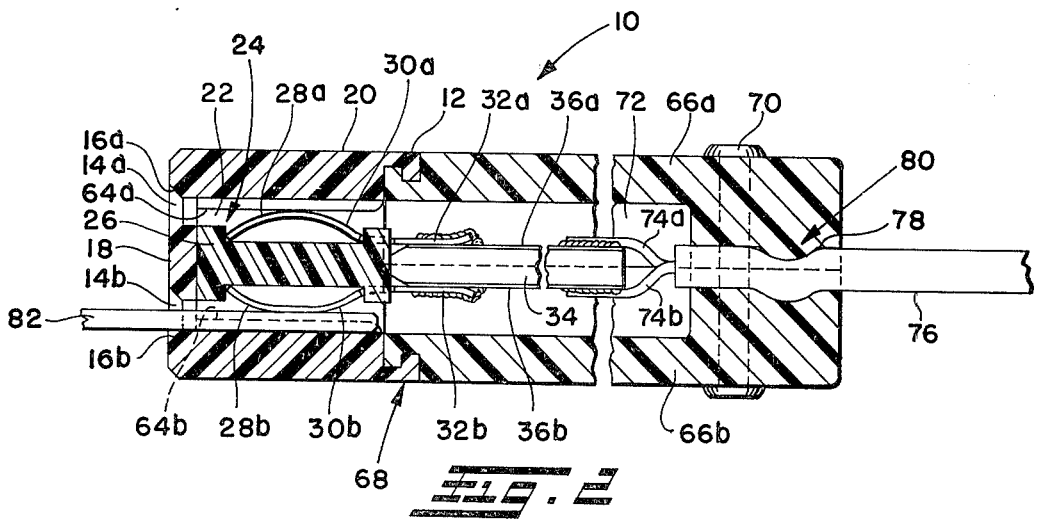
FIG. 2 is a section view of the connector taken on the line 2—2 of FIG. 1.

Turning now more particularly to FIG. 2, the housing 12 of the electrical connector 10 includes a main body portion 20 having a substantially hollow interior cavity 22 with the openings 14a, 14b providing access to the latter. Within the main body portion 20 is positioned a contact sub-assembly 24, which includes a contact carrier interstitial support member 26 on which are located a plurality of curved bow-type electrical contacts 28a, 28b. Each of the electrical contacts 28a, 28b has a forward curved bow portion 30a, 30b and a rearwardly extending generally flat tail portion 32a, 32b between which a printed circuit board 34 may be positioned, preferably in wedging engagement with that respective printed circuits 36a, 36b, shown exaggerated for clarity, are in direct connection with the contact tail portions. As thus described, such electrical connector 10 forms an output connector for such printed circuit board 34, whereby each of the electrical contacts 28a, 28b forms an electrical extension of a respective circuit printed on the printed circuit board.

Figure 3:
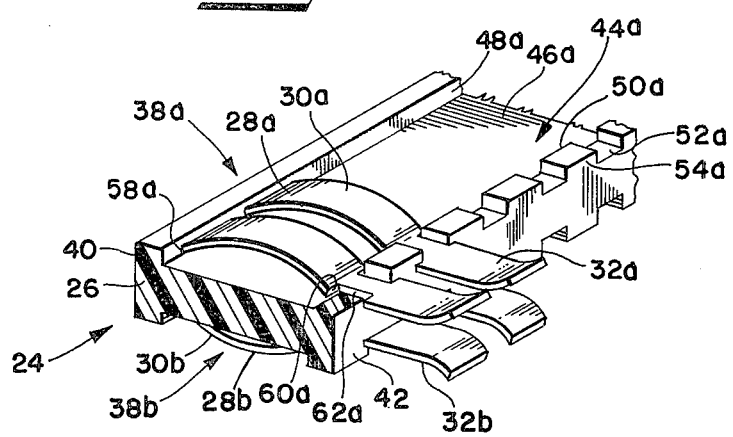
FIG. 3 is a fragmentary isometric view of the contacts and interstitial member of the connector.

The contact sub-assembly 24 is separately illustrated in FIG. 3. The interstitial member 26 has opposed upper and lower surfaces 38a, 38b and forward and rear edges 40, 42, the former intended for abutment with the interior of the housing front wall 18 and the latter intended to be abutted by the leading edge of the printed circuit board 34. For convenience of description only the upper portion of the contact sub-assembly 24 will be described in detail, although it is to be understood that the lower portion thereof is preferably similarly formed.

A substantially rectangular-shape groove 44a, is formed in the upper surface 38a of the interstitial member 26, and such groove is defined by a bottom wall 46a and forward and rear walls 48a, 50a, the top of the groove being open. The rear wall 50a is intermittently interrupted by respectively spaced passageways 52a effectively defining a plurality of upstanding stakes or pegs 54a therebetween. Preferably the interstitial member 26 is formed of a material similar to that of the housing 12, and the various dimensional parameters thereof, such as the overall thickness of the member, the depth of the respective grooves 44a, 44b and the width of the grooves, may be varied depending on the dimensional parameters of the electrical contacts 28a, 28b and those of the connector pins to which the latter are to be connected.

Each of the electrical contacts, such as the electrical contact 28a, has a relatively sharp forward or leading edge 58a of the curved bow portion 30a that preferably bites into the material of the interstitial member at the juncture of the forward and bottom walls of the groove 44a. Moreover, a shoulder 60a at the juncture of the electrical contact curved bow and tail portions also preferably has a relatively sharp edge to bite into the material of the interstitial member at the juncture of the rear and bottom walls of the groove. The tail portion 32a of the electrical contact passes through the passageway 52a beyond the rear edge 42 of the interstitial member. Moreover, the part 62a of the contact tail portion located within the passageway 52a is preferably of a reduced cross-section relative to the major extent of the tail portion beyond the rear edge 42 of the interstitial member, thereby defining a cut-out for positional alignment between adjacent pegs 54a, the forward-most portion of such reduced cross-section cut-out part being at the shoulder 60a. If desired, however, the entire contact tail portion 32a may be of the same narrow cross-section as that part 62a between the pegs 54a. The dimensional parameters of the respective electrical contacts 28a, 28b may be varied, depending on those of the interstitial member 26 so that the contact sub-assembly will make good electrical connections with inserted connector pins of given size and spacing parameters.

At least part of each of the curved bow portions 30a, 30b of the electrical contacts extends beyond the respective planes of the upper and lower surfaces 38a, 38b of the interstitial member 26. When the contact sub-assembly 24 is inserted into the cavity 22 of the main body portion 20, a plurality of respective raised elongated land portions 64a, 64b, which extend in directions parallel to the direction of insertion through the respective openings 14a, 14b and proximate opposed side edges of each of the electrical contacts, provide a slight pre-load force to the latter to ensure that the interstitial member and the contacts thereon remain properly positioned with respect to each other and within the housing cavity 22. Thus, adjacent land portions 64a, 64b define respective elongated relatively shallow channels parallel to the direction of extent of the electrical contacts 28a, 28b and such channels provide guidance for a connector pin during its insertion into the housing for ensuring alignment and good electrical connection with a respective electrical contact. If desired, additional means may be provided within the main body portion 20 of the housing 12 for more rigid retention of the contact sub-assembly 24.

As indicated above, the electrical connector 10 may be used as a cable termination device, and in such case the housing 12 additionally comprises rear enclosure covers portions 66a, 66b coupled to the main body portion at a snap-type T-joint arrangement 68 and to each other by one or more rivet screw or similar fasteners 70. The enclosure covers 66a, 66b define an enclosed cavity portion 72 within which is contained the printed circuit board 34, which provides a plurality of printed circuit conductive paths 36a, 36b as respective electrical interfaces between conductors 74a, 74b from a multiple conductor electrical cable 76 soldered at one end thereof and electrical contact tail portions 32a, 32b preferably soldered to the other end thereof. The enclosure covers 66a, 66b also define a slot 78 proximate the rear portion thereof to provide an entrance way for the multiple conductor electrical cable 76, and, if desired, an integral strain relief arrangement may be formed proximate said slot as indicated at 80.

In manufacturing and assembling the electrical connector 10, the housing main body portion 20 and the interstitial member 26 may be molded as respective single parts, and the electrical contacts 28 may be stamped or otherwise formed in the configuration illustrated. If desired, a row of adjacent electrical contacts may be attached at the remote end of their respective tail portions to a common breakaway stub for convenience of simultaneously positioning the same in a common groove 44 and within respective adjacent passageways of an interstitial member 26, and after such positioning the stub may be broken away for electrical isolation of such electrical contacts. The contact sub-assembly 24 is then inserted into the main body portion cavity 22 before or after which the printed circuit board 34 is wedged between the opposed contact tail portions 32a, 32b, which may be soldered to respective printed circuits 36a, 36b. If the electrical connector 10 is used as a cable termination device, the printed circuit board 34 is sufficiently small to fit within the enclosed cavity portion 72, and the respective conductors of the multiple conductor electrical cable 76 are soldered to respective circuits thereon. The enclosure covers 66a, 66b may then be fastened by the fasteners 70, retaining the electrical cable 76 in strain relief relation within the slot 78, and the enclosure covers are snapped into the T-joint for attachment to the main body portion 20.

Normally a plurality of electrical connector pins arranged in an array on a male plug-type electrical connector are inserted into respective openings 14a, 14b of the electrical connector 10 for electrical connection with respective electrical contacts 28a, 28b therein. For convenience of illustration and discussion, however, only a single connector pin 82 is illustrated in inserted position in engagement with the electrical contact 28b, although connections to the other electrical contacts would be substantially identical. Upon insertion of the connector pin 82 into the opening 14b, the leading edge thereof is guided in the channel defined between adjacent raised land portions 64b into engagement with the contact curved bow portion 30b causing the same to flatten providing a relatively large surface area of electrical connection with such connector pin. The forces developed in the contact bow portion 30b during such deformation are opposed by the relatively rigid interstitial member 26 where the former engages the latter, thus preventing force transmission to the tail portion 32b; therefore, the connection between the latter and a printed circuit 36b remains substantially free of stress increasing the longevity of the electrical connector.

Moreover, as the connector pin 82 is inserted by the contact bow portion 30b, the latter wipes the former further increasing the effectiveness of the electrical connection therebetween. It is to be understood that the electrical contacts 28a, 28b are highly compliant, i.e. are relatively insensitive to insertion problems caused by connector pin misalignment or the like, because the spring force of the contact bow portion against an inserted connector pin increases as it is deformed, thus resisting such deformation and urging such connector pin straight into the housing. Also, the arrangement of electrical contacts 28 on opposed sides of a common interstitial member 26 effects a balance of forces between respective connector pin rows ensuring good electrical connection with each of the connector pins. Furthermore, if either the spacing between connector pin rows or the cross-section size of respective connector pins should vary, the contact sub-assembly 24 may be removed from the housing 12 for replacement with a similar sub-assembly of appropriate parameters for effective electrical connection with such pins.

The embodiments of the invention in which an exclusive property or privilege is claimed are defined as follows:

1. An electrical connector for coupling in stress-free relation to a printed circuit board or the like to provide for electrical connection between the latter and electrically conductive means inserted into the connector, comprising:

an electrically non-conductive housing having an interior cavity and front and rear faces, opening means in the front face of the housing for access to said cavity by such inserted electrically conductive means, plural raised land portion means extending in said cavity parallel to the direction of entry through said opening means to define at least one channel in said cavity for guiding such electrically conductive means upon insertion thereof;

electrical contact means for electrically connecting such printed circuit board or the like and such inserted electrically conductive means, each electrical contact means including deformable bow portion means for abutting connection to such inserted electrically conductive means, and having opposed ends, and tail portion means extending beyond one of said ends for coupling to such printed circuit board;

an electrically non-conductive interstitial support means positioned in said cavity for supporting said electrical contact means, groove means in said interstitial support means opening toward said at least one channel for retaining said opposed ends of said bow portion means in relatively fixed position therein, and passageway means for passing said tail portion means from said groove, relatively free from stresses imposed on said bow portion means upon deformation of the latter by such inserted electrically conductive means, toward the rear of said housing for coupling to such printed circuit board or the like.

2. An electrical connector as set forth in claim 1, wherein groove means comprises a continuous groove and said electrical contact means comprises a plurality of electrical contacts retained in said groove.

3. An electrical connector as set forth in claim 2, wherein said opening means comprises a plurality of openings in said front face providing access to respective electrical contacts, and said plurality of raised land portions define a plurality of baffles spaced between respective openings and extending parallel to said contacts, whereby each of a plurality of electrically conductive means inserted through a respective opening is guided by respective baffles to engagement with only a single electrical contact.

4. An electrical connector as set forth in claim 1, wherein said raised land portions include means for applying a pre-load force on said electrical contact means urging thhe latter into said groove means.

5. An electrical connector as set forth in claim 1, wherein said electrical contact means comprises a shoulder formed at the juncture of said bow portion means and said tail portion means, said shoulder normally being in engagement with said interstitial support means in said groove means at said passageway means.

6. An electrical connector as set forth in claim 1, wherein said tail portion means of said electrical contact means extends from said passageway means externally of said housing at the rear thereof for soldered connection to such printed circuit board or the like.

7. An electrical connector as set forth in claim 1, wherein said electrical contact means comprises a plurality of electrical contacts retained in said groove means in said housing, and said passageway means comprises a corresponding plurality of passageways for respective tail portion means of said electrical contacts.

8. An electrical connector as set forth in claim 1, wherein said groove means is rectangular shape.

9. An electrical connector as set forth in claim 1, wherein said interstitial support means comprises upper and lower surfaces, each including respective groove means, passageway means and electrical contact means substantially identically formed for coupling to both sides of such printed circuit board or the like.

10. An electrical connector as set forth in claim 9, wherein said interstitial support means and said electrical contact means comprise a contact sub-assembly removable from said housing cavity for replacement by a similar sub-assembly having different parameters for connection to inserted electrically conductive means of correspondingly different parameters.

11. An electrical connector as set forth in claim 9, wherein said tail portion means of each said electrical contact means on each upper and lower surface of said interstitial support means extends from respective passageway means to exit said housing at the rear thereof for coupling to such printed circuit board or the like.

12. An electrical connector as set forth in claim 9, wherein said electrical contact means comprise a plurality of electrical contacts in each of said groove means.

13. An electrical connector as set forth in claim 12, wherein said opening means comprise a plurality of openings in said front face of said housing for access to respective electrical contacts in said housing.

14. An electrical connector as set forth in claim 1, wherein said housing further comprises enclosure means for enclosing such printed circuit board, a slot formed in said enclosure means for passing an electrical cable into said enclosure means for connection to respective printed circuits on such printed circuit board and thus being in electrical connection to respective electrical contacts in said housing.

15. An electrical connector as set forth in claim 1, wherein said bow portion means includes at least a section that extends outside said groove means for such abutting connection with inserted electrically conductive means.

* * * * *